US 8,313,582 B2

(12) United States Patent
O'Donnell et al.

(10) Patent No.: US 8,313,582 B2
(45) Date of Patent: Nov. 20, 2012

(54) SYSTEM, METHOD AND APPARATUS FOR MAINTAINING SEPARATION OF LIQUIDS IN A CONTROLLED MENISCUS

(75) Inventors: Robert O'Donnell, Fremont, CA (US); Cheng-Yu (Sean) Lin, Mountain View, CA (US); Arnold Kholodenko, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/370,119

(22) Filed: Feb. 9, 2012

(65) Prior Publication Data

US 2012/0138098 A1 Jun. 7, 2012

Related U.S. Application Data

(62) Division of application No. 11/820,590, filed on Jun. 19, 2007, now Pat. No. 8,141,566.

(51) Int. Cl.
*B08B 3/00* (2006.01)
(52) U.S. Cl. ........ 134/26; 134/1.3; 134/95.2; 134/104.2
(58) Field of Classification Search .................. None
See application file for complete search history.

(56) References Cited

U.S. PATENT DOCUMENTS

| 2004/0069319 A1* | 4/2004 | Boyd et al. ............. 134/1.3 |
| 2006/0038968 A1* | 2/2006 | Kemper et al. .......... 355/18 |
| 2006/0064895 A1* | 3/2006 | Garcia et al. ........... 34/566 |
| 2006/0087630 A1* | 4/2006 | Kemper et al. .......... 355/30 |
| 2006/0088982 A1* | 4/2006 | Boyd et al. ............. 438/460 |

FOREIGN PATENT DOCUMENTS

JP 2003151948 A * 5/2003

OTHER PUBLICATIONS

Kasuga, Hirobumi, May 2003, JP 2003-151948, English machine translation.*

* cited by examiner

*Primary Examiner* — Michael Barr
*Assistant Examiner* — Jason Ko
(74) *Attorney, Agent, or Firm* — Martine Penilla Group, LLP

(57) ABSTRACT

A system and method of forming and using a proximity head. The proximity head includes a head surface including a first zone, a second zone and an inner return zone. The first zone including a first flat surface region and multiple first discrete holes connected to a corresponding first conduit and arranged in a first row. The second zone including a second flat region and multiple second discrete holes connected to a corresponding second conduit. The inner return zone being disposed between and adjacent to the first zone and the second zone and including multiple inner return discrete holes connected to a corresponding inner return conduit and arranged in an inner return row. The first row and the inner return row are parallel. A portion of an edge of each of the inner return discrete holes is recessed into the head surface.

19 Claims, 13 Drawing Sheets

SYSTEM, METHOD AND APPARATUS FOR MAINTAINING SEPARATION OF LIQUIDS IN A CONTROLLED MENISCUS

CROSS REFERENCE TO RELATED APPLICATIONS

This application is a divisional of and claims priority to co-owned U.S. patent application Ser. No. 11/820,590, filed on Jun. 19, 2007 now U.S. Pat. No. 8,141,566 and entitled "SYSTEM, METHOD AND APPARATUS FOR MAINTAINING SEPARATION OF LIQUIDS IN A CONTROLLED MENISCUS," which is incorporated herein by reference in its entirety for all purposes. This application is related to co-pending and co-owned U.S. patent application Ser. No. 10/611,140, filed on Jun. 30, 2003 and entitled "METHOD AND APPARATUS FOR CLEANING A SUBSTRATE USING MEGASONIC POWER," which is incorporated herein by reference in its entirety for all purposes. This application is related to co-pending and co-owned U.S. patent application Ser. No. 10/330,843, filed on Dec. 24, 2002 and entitled "MENISCUS, VACUUM, IPA VAPOR, DRYING MANIFOLD," which is incorporated herein by reference in its entirety for all purposes. This application is also related to co-pending and co-owned U.S. patent application Ser. No. 10/330,897, filed on Dec. 24, 2002 and entitled "SYSTEM FOR SUBSTRATE PROCESSING WITH MENISCUS, VACUUM, IPA VAPOR, DRYING MANIFOLD," which is incorporated herein by reference in its entirety for all purposes. This application is also related to co-pending and co-owned U.S. patent application Ser. No. 10/261,839, filed on Sep. 30, 2002 and entitled "METHOD AND APPARATUS FOR DRYING SEMICONDUCTOR WAFER SURFACES USING A PLURALITY OF INLETS AND OUTLES HELD IN CLOSE PROXIMITY TO THE WAFER SURFACES," which is incorporated herein by reference in its entirety for all purposes.

BACKGROUND

The present invention relates generally to semiconductor manufacturing processes, and more particularly, to methods and systems for processing semiconductors with a proximity head.

In the semiconductor chip fabrication process, it is well-known that there is a need to clean and dry a wafer where a fabrication operation has been performed that leaves unwanted residues on the surfaces of wafers. Examples of such a fabrication operation include plasma etching and chemical mechanical polishing (CMP). In CMP, a wafer is placed in a holder that pushes a wafer surface against a polishing surface. Slurry can include chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface.

In an attempt to accomplish this, one of several different drying techniques is employed, such as spin-drying and the like. These drying techniques utilize some form of a moving liquid/gas interface on a wafer surface that, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants and/or spots being left on the wafer surface.

In view of the forgoing, there is a need for drying technique that minimizes the effects of droplets on the surface of the substrate or substantially eliminates the formation of droplets on the surface of the substrate.

SUMMARY

Broadly speaking, the present invention fills these needs by providing an improved proximity head and a system and method for using the improved proximity head. It should be appreciated that the present invention can be implemented in numerous ways, including as a process, an apparatus, a system, computer readable media, or a device. Several inventive embodiments of the present invention are described below.

One embodiment provides a proximity head. The proximity head includes a head surface, the head surface including a first zone, a second zone and an inner return zone. The first zone including a first flat surface region and a plurality of first discrete holes. Each one of the plurality of first discrete holes being connected to a corresponding one of a plurality of first conduits. The plurality of first discrete holes residing in the head surface and extending through the first flat surface region. At least a portion of the plurality of first discrete holes are arranged in a first row. The second zone including a second flat region and a plurality of second discrete holes. Each one of the plurality of second discrete holes being connected to a corresponding one of a plurality of second conduits. The plurality of second discrete holes residing in the head surface and extending through the second flat surface region. The inner return zone including a plurality of inner return discrete holes. The inner return zone being disposed between and adjacent to the first zone and the second zone. Each one of the plurality of the inner return discrete holes being connected to a corresponding one of a plurality of inner return conduits. The plurality of inner return discrete holes residing in the head surface and extending through the head surface. At least a portion of the plurality of inner return discrete holes are arranged in an inner return row. The first row and the inner return row being substantially parallel. A first portion of an edge of each one of the plurality of inner return discrete holes is recessed into the head surface.

The first zone can also include a plurality of third discrete holes, each one of the plurality of third discrete holes being connected to a corresponding one of a plurality of third conduits. The plurality of third discrete holes residing in the head surface and extending through the first flat surface region. At least a portion of the plurality of third discrete holes are arranged in a third row. The third row being substantially parallel to the first row and being disposed on a side of the first row opposing the interface row.

The plurality of first conduits can be coupled to a first liquid source and configured to provide a first liquid to the head surface. The second conduits can be coupled to a second liquid source and configured to provide a second liquid to the head surface. The plurality of inner return conduits and the plurality of third conduits can be coupled to a vacuum source and configured to remove at least a portion of the first liquid from the head surface.

The recessed first portion of an edge of each one of the plurality of inner return discrete holes is recessed into the head surface at a first angle, the first angle forms a chamfer extending from the recessed first portion of an edge of each one of the plurality of inner return discrete holes toward the first row for a first distance.

The recessed first portion of an edge of each one of the plurality of inner return discrete holes can be included in a recessed first angled portion having a first recessed edge at each one of the plurality of inner return discrete holes and the recessed first angled portion including a second recessed edge intersecting the head surface and wherein the recessed first angled portion extends from the inner return row toward the first row for a first distance.

The recessed first angled portion can include more than one angled portions. The recessed first angled portion can include one or more curved portions. The first recessed edge can include a curved portion from the recessed first angled portion into each one of the plurality of inner return discrete holes.

At least a portion of the plurality of second discrete holes can be arranged in a second row. The second row and the inner return row being substantially parallel. The second row opposing the first row and wherein the second zone further includes a plurality of fifth discrete holes and plurality of sixth discrete holes. Each one of the plurality of fifth discrete holes being connected to a corresponding one of a plurality of fifth conduits and each one of the plurality of sixth discrete holes being connected to a corresponding one of a plurality of sixth conduits. The plurality of fifth discrete holes and the plurality of sixth discrete holes residing in the head surface and extending through the second flat surface region. At least a portion of the plurality of fifth discrete holes are arranged in a third row and at least a portion of the plurality of sixth discrete holes are arranged in a fifth row. The third row and at least a portion of the fourth row being substantially parallel to the second row. The third row being disposed on a side of the second row opposing the inner return row, the fourth row being disposed on a side of the third row opposing the second row.

The plurality of first conduits can be coupled to a first liquid source and configured to provide a first liquid to the head surface, the plurality of second conduits are coupled to a second liquid source and configured to provide a second liquid to the head surface, the plurality of inner return conduits and the plurality of fifth conduits being configured to remove at least a portion of the second liquid from the head surface, the plurality of sixth conduits being configured to provide a first fluid to the head surface, the first fluid being different than the first liquid and the second liquid.

The second zone can include a protrusion having an angled surface. The angled surface having a first edge and the first edge intersecting the head surface between the second row and the inner return row. The angled surface having a second edge proximate to the inner return row. The second edge protruding from the head surface a protruding distance less than a distance between the head surface and a surface to be processed. The angled surface can intersect the head surface at an angle of between about 1 degree and about 89 degrees. The angled surface can include more than one angled surface. At least one of the more than one angled surface is substantially parallel to the head surface.

At least a portion of the plurality of second conduits can intersect the head surface at an angle of between about 10 degrees and about 90 degrees and directed toward the inner return row. At least a portion of at least one of the first flat surface region and the second flat surface region can be curved.

Another embodiment provides a proximity head. The proximity head including a head surface, the head surface including a first zone, a second zone and an inner return zone. The first zone including a first flat surface region and a plurality of first discrete holes. Each one of the plurality of first discrete holes being connected to a corresponding one of a plurality of first conduits. The plurality of first discrete holes residing in the head surface and extending through the first flat surface region. At least a portion of the plurality of first discrete holes are arranged in a first row. The second zone including a second flat region and a plurality of second discrete holes. Each one of the plurality of second discrete holes being connected to a corresponding one of a plurality of second conduits. The plurality of second discrete holes residing in the head surface and extending through the second flat surface region. The inner return zone including a plurality of inner return discrete holes. The inner return zone being disposed between and adjacent to the first zone and the second zone. Each one of the plurality of the inner return discrete holes being connected to a corresponding one of a plurality of inner return conduits. The plurality of inner return discrete holes residing in the head surface and extending through the head surface. At least a portion of the plurality of inner return discrete holes are arranged in an inner return row. The first row and the inner return row being substantially parallel. The second zone includes a protrusion having an angled surface, the angled surface having a first edge, the first edge intersecting the head surface between the second row and the inner return row, the angled surface having a second edge proximate to the inner return row, the second edge protruding from the head surface a protruding distance less than a distance between the head surface and a surface to be processed.

Another embodiment provides a proximity head. The proximity head including a head surface, the head surface including a first zone, a second zone and an inner return zone. The first zone including a first flat surface region and a plurality of first discrete holes. Each one of the plurality of first discrete holes being connected to a corresponding one of a plurality of first conduits. The plurality of first discrete holes residing in the head surface and extending through the first flat surface region. At least a portion of the plurality of first discrete holes are arranged in a first row. The second zone including a second flat region and a plurality of second discrete holes. Each one of the plurality of second discrete holes being connected to a corresponding one of a plurality of second conduits. The plurality of second discrete holes residing in the head surface and extending through the second flat surface region. The inner return zone including a plurality of inner return discrete holes. The inner return zone being disposed between and adjacent to the first zone and the second zone. Each one of the plurality of the inner return discrete holes being connected to a corresponding one of a plurality of inner return conduits. The plurality of inner return discrete holes residing in the head surface and extending through the head surface, at least a portion of the plurality of inner return discrete holes are arranged in an inner return row. The first row and the inner return row being substantially parallel. At least a portion of the plurality of second conduits intersect the head surface at an angle of between about 10 degrees and about 90 degrees and directed toward the inner return row.

Yet another embodiment provides a proximity head. The proximity head including a head surface, the head surface including a first zone, a second zone and an inner return zone. The first zone including a first flat surface region and a plurality of first discrete holes. Each one of the plurality of first discrete holes being connected to a corresponding one of a plurality of first conduits. The plurality of first discrete holes residing in the head surface and extending through the first flat surface region. At least a portion of the plurality of first discrete holes are arranged in a first row. The second zone including a second flat region and a plurality of second discrete holes. Each one of the plurality of second discrete holes being connected to a corresponding one of a plurality of second conduits. The plurality of second discrete holes residing in the head surface and extending through the second flat surface region. The inner return zone including a plurality of inner return discrete holes. The inner return zone being disposed between and adjacent to the first zone and the second zone. Each one of the plurality of the inner return discrete holes being connected to a corresponding one of a plurality of inner return conduits. The plurality of inner return discrete holes residing in the head surface and extending through the head surface. At least a portion of the plurality of inner return discrete holes are arranged in an inner return row. The first row and the inner return row being substantially parallel. A first portion of an edge of each one of the plurality of inner return discrete holes is recessed into the head surface and the second zone includes a protrusion having an angled surface. The angled surface having a first edge and the first edge intersecting the head surface between the second row and the inner return row. The angled surface having a second edge proximate to the inner return row, the second edge protruding from the head surface a protruding distance less than a distance between the head surface and a surface to be processed. At least a portion of the plurality of second conduits intersect the head surface at an angle of between about 10 degrees and about 90 degrees and directed toward the inner return row.

Still another embodiment provides a method of forming a meniscus including moving a proximity head in close proximity to a surface to be processed. The proximity head including a head surface, the head surface including a first zone, a second zone and an inner return zone. The first zone including a first flat surface region and a plurality of first discrete holes. Each one of the plurality of first discrete holes being connected to a corresponding one of a plurality of first conduits. The plurality of first discrete holes residing in the head surface and extending through the first flat surface region. At least a portion of the plurality of first discrete holes are arranged in a first row. The second zone including a second flat region and a plurality of second discrete holes. Each one of the plurality of second discrete holes being connected to a corresponding one of a plurality of second conduits. The plurality of second discrete holes residing in the head surface and extending through the second flat surface region. The inner return zone including a plurality of inner return discrete holes. The inner return zone being disposed between and adjacent to the first zone and the second zone. Each one of the plurality of the inner return discrete holes being connected to a corresponding one of a plurality of inner return conduits. The plurality of inner return discrete holes residing in the head surface and extending through the head surface. At least a portion of the plurality of inner return discrete holes are arranged in an inner return row, the first row and the inner return row being substantially parallel. The method further includes forming a dual liquid meniscus between the head surface and the surface to be processed and removing a portion of the first liquid and the second liquid through the inner return including decreasing a velocity of the first liquid proximal to the inner return to a first velocity and wherein the first velocity is less than a second velocity of the second liquid proximal to the inner return. The second velocity can also be increased proximal to the inner return.

Yet another embodiment provides a method of forming a meniscus including moving a proximity head in close proximity to a surface to be processed. The proximity head including a head surface, the head surface including a first zone, a second zone and an inner return zone. The first zone including a first flat surface region and a plurality of first discrete holes. Each one of the plurality of first discrete holes being connected to a corresponding one of a plurality of first conduits. The plurality of first discrete holes residing in the head surface and extending through the first flat surface region. At least a portion of the plurality of first discrete holes are arranged in a first row. The second zone including a second flat region and a plurality of second discrete holes. Each one of the plurality of second discrete holes being connected to a corresponding one of a plurality of second conduits. The plurality of second discrete holes residing in the head surface and extending through the second flat surface region. The inner return zone including a plurality of inner return discrete holes. The inner return zone being disposed between and adjacent to the first zone and the second zone. Each one of the plurality of the inner return discrete holes being connected to a corresponding one of a plurality of inner return conduits. The plurality of inner return discrete holes residing in the head surface and extending through the head surface. At least a portion of the plurality of inner return discrete holes are arranged in an inner return row. The first row and the inner return row being substantially parallel. The method further includes forming a dual liquid meniscus between the head surface and the surface to be processed and removing a portion of the first liquid and the second liquid through the inner return including increasing a velocity of the second liquid proximal to the inner return to a second velocity and wherein the second velocity is greater than a first velocity of the first liquid proximal to the inner return.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for a proximity head will now be described. It will be apparent to those skilled in the art that the present invention may be practiced without some or all of the specific details set forth herein.

Various embodiments of the proximity head 100 are described in more detail in co-owned U.S. patent application Ser. No. 10/330,843 filed on Dec. 24, 2002 and entitled "Meniscus, Vacuum, IPA Vapor, Drying Manifold," and co-owned U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces." Various embodiments and applications of proximity heads are also described in co-owned U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,270, filed on Mar. 31, 2003, entitled "Vertical Proximity Processor," and U.S. patent application Ser. No. 10/404,692 filed on Mar. 31, 2003, entitled Methods and Systems for Processing a Substrate Using a Dynamic Liquid Meniscus. The aforementioned patent applications are hereby incorporated by reference in their entirety.

Figure 1A:
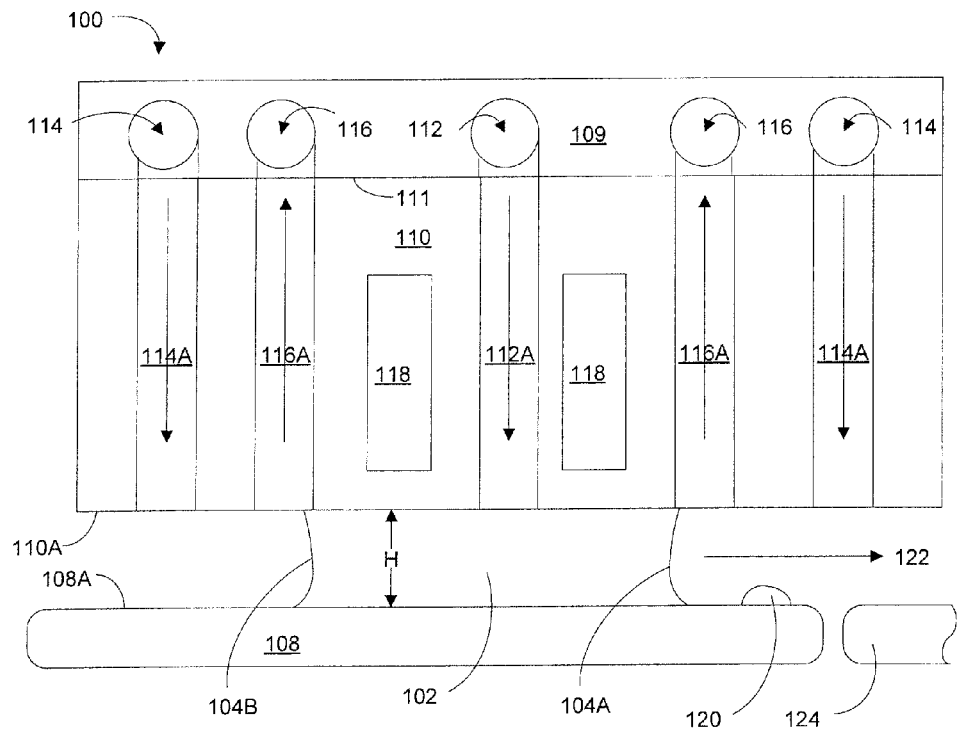
FIG. 1A illustrates a proximity head performing an operation on a surface of a substrate, in accordance with one embodiment of the present invention.

FIG. 1A illustrates a proximity head 100 performing an operation on a surface 108A of a substrate 108, in accordance with one embodiment of the present invention. The proximity head 100 can move relative to and while in close proximity to the top surface 108A of an item being processed 108. The item 108 being processed can be any type of item (e.g., a metal item, a ceramic, a plastic, a semiconductor substrate, or any other desired item). It should be appreciated that the proximity head 100 may also be utilized to process (e.g., clean, dry, etch, plate, etc.) a bottom surface 108B of the item 108.

The proximity head 100 includes one or more first conduits 112A for delivering a first liquid 112 to a head surface 110A of the proximity head. The proximity head 100 also includes one or more second conduits 114A for delivering a second fluid 114 to the head surface 110A. The second fluid 114 can be different than the first liquid 112 as will be discussed in more detail below. The proximity head 100 also includes multiple third conduits 116A for removing the first liquid 112 and the second fluid 116 from the head surface 110A.

Figure 1B:
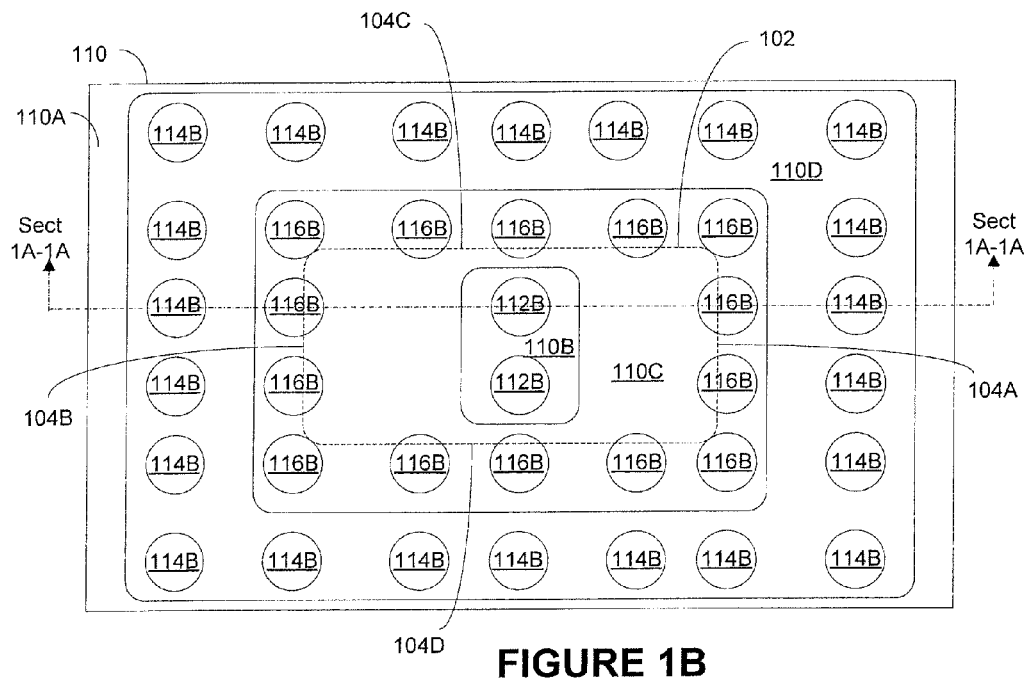
FIG. 1B is a view of the head surface of the proximity head, in accordance with an embodiment of the present invention.

FIG. 1B is a view of the head surface 110A of the proximity head 100, in accordance with an embodiment of the present invention. The head surface 110A includes substantially flat regions 110B, 110C, 110D. The substantially flat region 110B includes one or more discrete holes 112B that define the opening to one of the corresponding first conduits 112A. Similarly, the substantially flat region 110C includes one or more discrete holes 114B that define the opening to one of the corresponding second conduits 114A and the substantially flat region 110D includes one or more discrete holes 116B that define the opening to one of the corresponding third conduits 116A. The discrete holes 112B, 114B and 116B can be any desirable shape (e.g., substantially round, elliptical, etc.), the same or different sizes. By way of example, the discrete holes 112B can be smaller or larger than discrete holes 114B and 116B.

It should be understood that the proximity head 100 described in FIGS. 1A and 1B is a simplified exemplary proximity head. The proximity head 100 can be in many different shapes and sizes. For example, the proximity head can be round, elliptical, annular and any other desired shape. Similarly, the meniscus 102 can be any desired shape as may be defined by the arrangement of the discrete openings 112B, 114B and 116B including but not limited to round, elliptical, rectangular, annular, concave, etc. Further the flat regions 110B, 110C and 110D can be any shape. By way of example, the flat region 110B can be circular, rectangular, elliptical or any other shape desired. The second flat region 110C including the third discrete holes 116B can fully encompass the flat region 110B or only a portion of the flat region 110B. Similarly, the third flat region 110D including the second discrete holes 114B can fully encompass the flat regions 110B and 110C or only a portion of the flat regions 110B and 110C. By way of example, the second discrete holes 114B can be limited to only the trailing edge 104B and/or the leading edge 104A and/or one or more portions of the sides 104C and 104D, such as described in one or more of the above referenced co-pending applications which are incorporated by reference in their entirety for all purposes. The holes 112B, 114B, 116B and the corresponding conduits 112A, 114A, 116A can have a diameter of between about 0.004 to about 0.200 inches (i.e., 0.1 mm to about 5.0 mm). The holes 112B, 114B, 116B and the corresponding conduits 112A, 114A, 116A typically have a diameter of about 0.030 inches (i.e., about 0.75 mm).

Figure 1C:
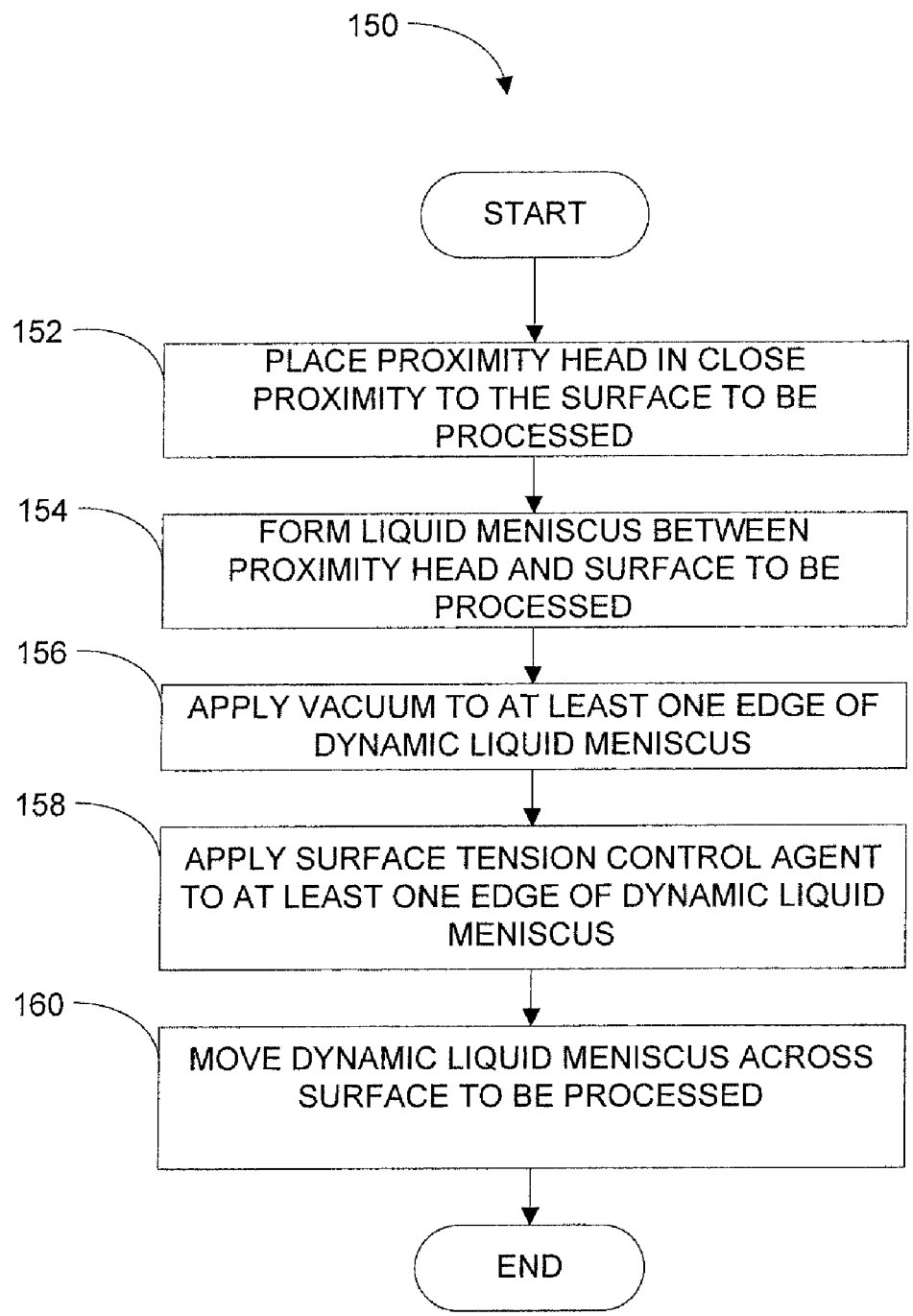
FIG. 1C is a flowchart of the method operations of processing a surface, in accordance with an embodiment of the present invention.

FIG. 1C is a flowchart of the method operations 150 of processing a surface 108A, in accordance with an embodiment of the present invention. In an operation 152, the proximity head 100 is placed in close proximity to the substrate surface 108A for processing. The close proximity H as shown in FIG. 1A can be from about 5 mm to less than about 0.5 mm.

In an operation 154, a liquid 112 is output from one or more first conduits 112A and the corresponding discrete hole 112B to form a controlled, contained, liquid meniscus 102 between the head surface 110A and the substrate surface 108A. The surface tension of the liquid 112 causes the liquid to be "attached" or attracted to both the head surface 110A and the substrate surface 108A. As a result, the outer walls 104a, 104B of the meniscus 102 are formed as the surface of the liquid 112 is drawn between the head surface 110A and the substrate surface 108A. The liquid 112 can be any suitable liquid solution for the desired process. By way of example the liquid 112 can be water, de-ionized water (DIW), a cleaning fluid, an etching solution, a plating solution, etc.

In an operation 156, a vacuum is applied to one or more of the third conduits 116A. The vacuum draws the liquid 112 from the meniscus 102 into the discrete holes 116B and into the corresponding conduits 116A. The liquid 112 drawn from the meniscus 102 can be more or less than the amount of liquid flowing into the meniscus from the first conduits 112A. Bay way of example, there may be a greater number of third conduits 116A than there are first conduits 112A in the proximity head 100. Further, as the meniscus 102 is moved across the surface 108A, the meniscus can gather additional liquids and other contaminants from the surface.

Each one of the third conduits 116A and the corresponding discrete holes 116B can at least partially surround the first discrete holes 112B so that the proximity head 100 can contain the meniscus between the head surface 110A and the substrate surface 108A. A quantity of the first liquid 112 can flow through the meniscus to provide a very controlled processing of the substrate surface 108A. By way of example, the first liquid 112 can be an etching chemistry for etching the substrate surface 108A. As the etching chemistry reacts with the substrate surface 108A, the reaction residues become entrained in the etching chemistry and the resulting contamination could reduce the concentration and etching capability of the etching chemistry. As the etching chemistry 112 is drawn away from the meniscus 102 through the third conduits 116A, the reaction residues and other contamination are carried away from the meniscus. Simultaneously, additional non-contaminated etching chemistry is supplied to the meniscus 102 through the first conduits 112A.

In an operation 160, the proximity head 100 can be moved relative to the substrate 108 (e.g., in direction 122) so as to move the meniscus 102 along the substrate surface 108A. The side 104A forms a leading edge of the meniscus 102 as the meniscus moves along the substrate surface 108A in direction 122. The meniscus 102 can remove contaminants 120 that are on the substrate surface 108A. The contaminant 120 can be a liquid droplet, a solid residue or any other contaminants and combinations thereof (e.g., solid contaminates in a liquid solution).

The side 104B forms a trailing edge of the meniscus 102 as the meniscus moves along the substrate surface 108A in direction 122. The surface tension of the liquid in the meniscus 102 causes substantially all liquids on the substrate surface 108A to be removed with the meniscus. In this manner the meniscus 102 can perform a drying operation by removing all liquid contaminants from the substrate surface 108A. Similarly, the meniscus 102 can perform a dry-in-dry-out processing operation by applying a, for example, a wet etching or plating chemistry to the substrate surface 108A in the meniscus and the trailing edge 104B will remove all liquids from the etching or plating process.

Moving the meniscus 102 across the substrate surface 108A can also include moving the meniscus across the substrate surface and off the edge of the substrate surface to a second surface 124 as described in one or more of the above referenced co-pending patent applications.

In an optional operation 158, a second fluid 114 can be applied to the substrate surface 108A. The second fluid 114 can be a surface tension controlling fluid. The surface tension controlling fluid can be one or more of isopropyl alcohol (IPA) vapor, nitrogen, organic compounds, hexanol, ethyl glycol, $CO_2$ gas, and other compounds miscible with water or combinations thereof. By way of example an IPA vapor can be carried by an inert carrier gas, such as nitrogen, and carried to the substrate surface 108A.

The proximity head 100 does not physically contact the substrate 108. Only the first liquid 112 and the second fluid 114 contact the substrate 108.

The proximity head 100 can also include additional instruments or heaters or other monitors 118. The additional instruments or heaters or other monitors 118 can be used to monitor the liquid 112 or the process being applied to the substrate surface 108A by the meniscus 102. By way of example the additional instruments or heaters or other monitors 118 can heat or cool the 112 and measure the surface (e.g., thickness of a layer on the surface 108 or the thickness of the substrate 108 or a depth of a surface feature) or the concentration or other chemical aspects (e.g., ph level, conductivity, etc.) of the liquid 112 or any other aspect as desired. These embodiments are described in more detail in one or more of the above referenced co-pending applications.

Figure 1D:
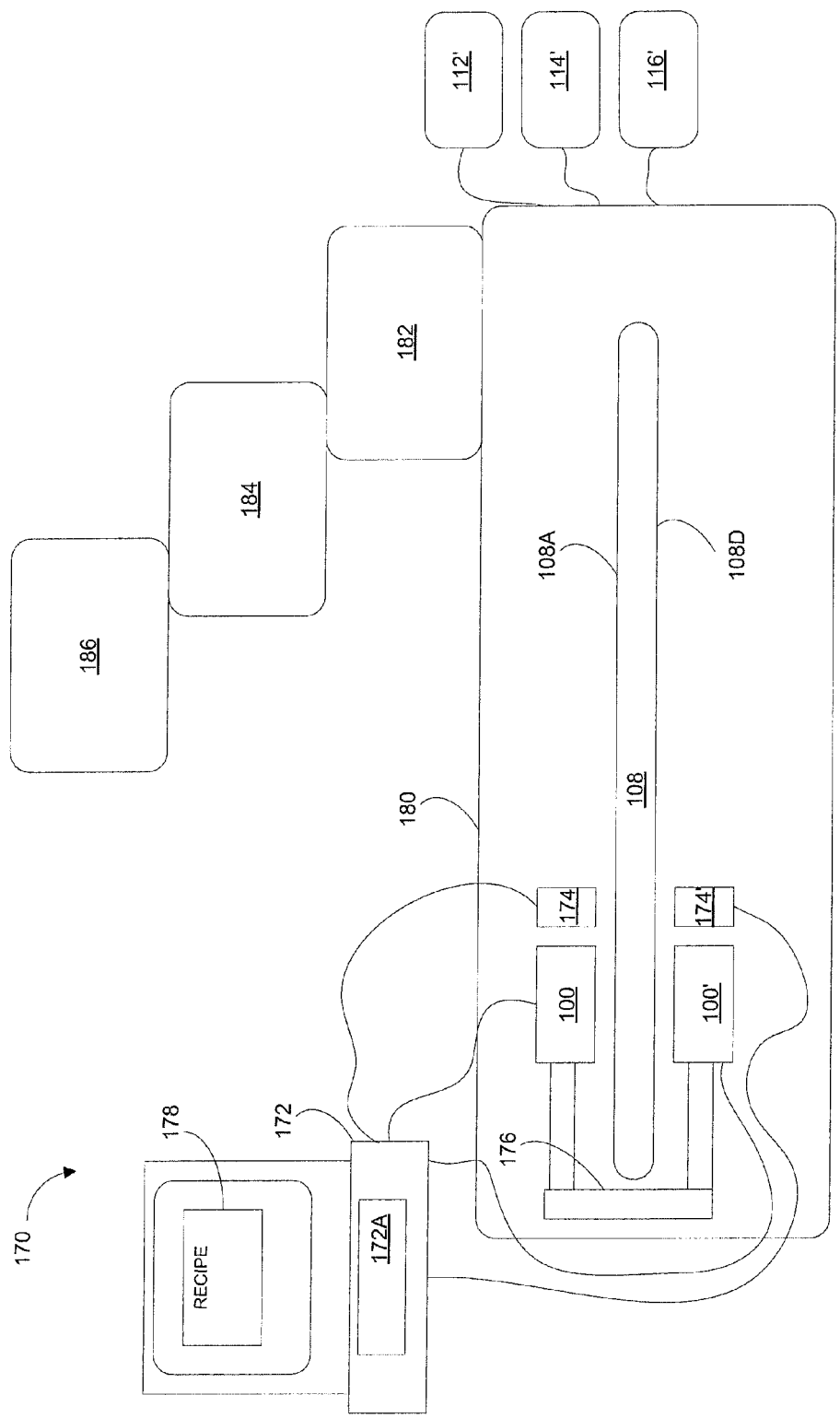
FIG. 1D is a simplified diagram of a proximity head system, in accordance with an embodiment of the present invention.

FIG. 1D is a simplified diagram of a proximity head system 170, in accordance with an embodiment of the present invention. The proximity head system 170 includes a process chamber 180, a controller 172, a vacuum source 116', a first liquid source 112', a second fluid source 114'. The first liquid source 112', the second fluid source 114, and the vacuum source 116' are coupled to the corresponding conduits 112, 114, 116 through appropriate control valves or other flow controlling mechanisms controlled by the controller 172.

The process chamber 180 can support more than one process. By way of example the process chamber 180 can support a plasma etching process and the proximity head 100 so that the plasma etching process can etch the item 108 and the proximity head can then rinse, clean and dry the item, insitu, within the single process chamber. The process chamber 180 can also be coupled to multiple other process chambers 182, 184, 186 such as are commonly referred to as a cluster tool.

The proximity head system 170 can also include a second proximity head 100' capable of processing a second surface 108B of the item 108. The proximity head system 170 can also include instruments 174 for monitoring the processes applied to the item 108. The proximity head system 170 can also include an actuator 176 coupled to the proximity head 100 and capable of supporting and/or moving the proximity head.

The controller 172 can also include a recipe 178. The recipe 178 defines the parameters of the processing in the process chamber. The controller 172 is coupled to the processing chamber 180 and the proximity head 100 and other portions of the processing chamber as needed for controlling the processing in the process chamber. The controller 172 also includes logic 172A for implementing the recipe 178 in the processes in the processing chamber 180. The logic 172A can also include the capability to monitor the results of the processes and adjust or modify one or more aspects of the recipe according to monitored results.

The item 108 can be moved relative to the proximity head 100. By way of example, the item can be a semiconductor wafer and can be rotated relative to the proximity head 100. Similarly, the item 108 can be substantially fixed in a single location and the proximity head 100 can be moved across the surface 108A of the item. It should also be understood that both the item 108 and the proximity head 100 can be movable. The relative motion of the proximity head 100 can be substantially, linear across the surface 108A or can be moved in a circular or spiral fashion. The motion of the proximity head 100 can be also be specifically moved from one location to another on the surface 108A as may be desired for a particular process being applied to the surface.

Figure 2A:
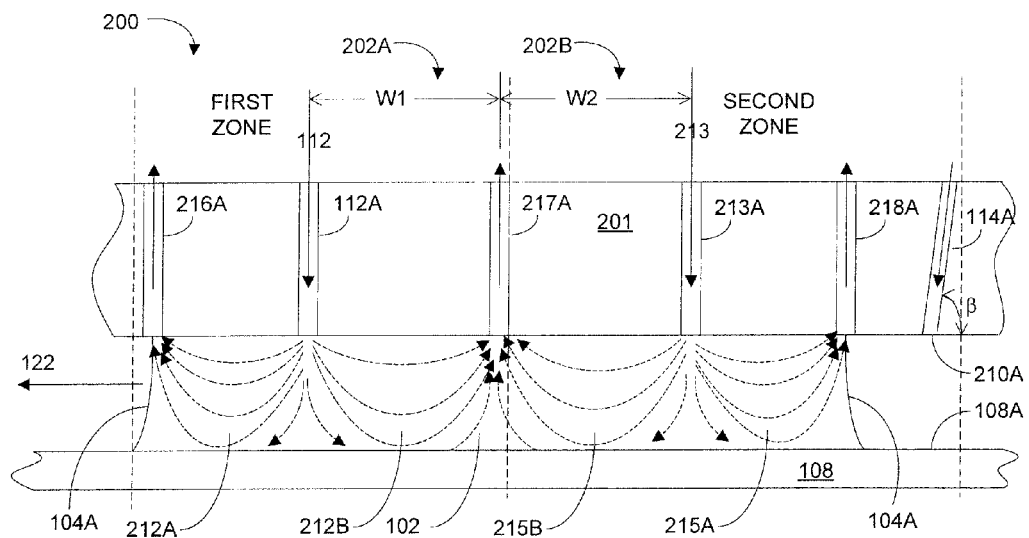
FIG. 2A is side view of a dual input proximity head, in accordance with an embodiment of the present invention.
Figure 2B:
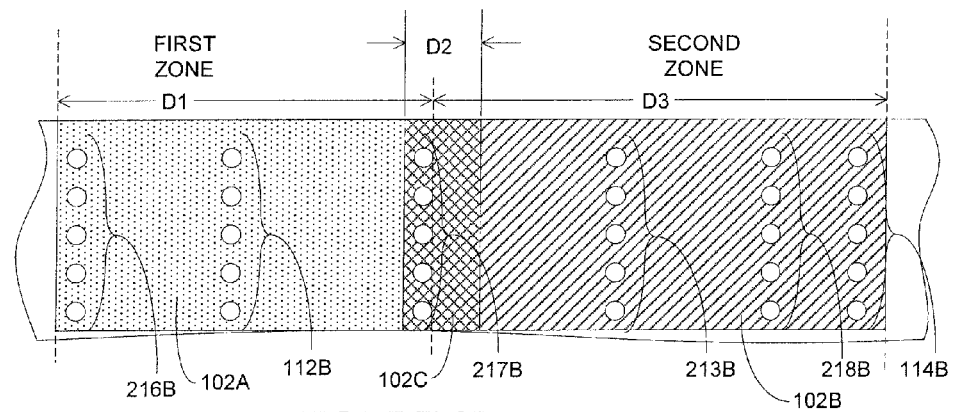
FIG. 2B is a bottom view of the meniscus and the head surface of the dual input proximity head, in accordance with an embodiment of the present invention.

FIG. 2A is side view of a dual input proximity head 200, in accordance with an embodiment of the present invention. FIG. 2B is a bottom view of the meniscus 102 and the head surface 210A of the dual input proximity head 200, in accordance with an embodiment of the present invention. The dual input proximity head 200 can support a meniscus 102 that is substantially divided into a first zone meniscus 102A in the first zone 202A and a second zone meniscus 102B in the second zone 202B. The first zone meniscus 102A and the second zone meniscus 102B are delineated by the inner return 217B holes that connect to the inner return 217A conduits.

The first conduits 112 and the corresponding holes 112B are separated from the inner return conduits 217A and the corresponding inner return holes 217B by a width W1. The second conduits 213A and the corresponding holes 213B are separated from the inner return conduits 217A and the corresponding inner return holes 217B by a width W2. Widths W1, W2 may or may not be equal. Widths W1, W2 can be between less than about 10 mm and greater than about 50 mm. The widths W1, W2 can be between about 12 mm to about 19 mm. In one embodiment, at least one of the widths W1, W2 is about 38 mm.

In operation, a first liquid 112 is supplied to the meniscus 102 through the first holes 112B. As shown by the flow arrows 212A and 212B, the first liquid 112 flows from the first holes 112B, into the meniscus 102. The first liquid 112 is removed through the first return holes 216B and the inner return holes 217B, respectively, when a vacuum source 116' is applied to the first return conduit 216A and the inner return conduit 217B.

Similarly, a second liquid 213 is supplied to the meniscus 102 through the second holes 213B when a second liquid source is connected to the second conduits 213A. As shown by the flow arrows 215A and 215B the second liquid 213 flows from the second holes 213B, into the meniscus 102 and is removed through the second return holes 218B and the inner return holes 217B, respectively, when a vacuum source is applied to the second return conduit 218A and the inner return conduit 217B.

The first liquid flowrate is the flowrate of the first liquid 112 through the first holes 112B and out the first return holes 216B and the inner return holes 217B. The second liquid flowrate is the flowrate of the second liquid 112 through the second holes 213B and out the second return holes 218B and the inner return holes 217B. The first liquid flowrate is typically approximately equal to the second liquid flowrate.

The dual input proximity head 200 can be used to perform two operations such as a clean or etch and a rinse. By way of example, the first liquid 112 can be an etching chemistry and the second liquid 213 can be a rinsing liquid. As a result, as the proximity head 200 moves in direction 122, the surface 108A can be etched in the first zone 202A and rinsed in the second zone 202B and fully dried by the action of the trailing edge 104A of the meniscus 102. Therefore, a dry in, dry out etching and rinsing processes can be applied to the surface 108A in a single pass of the surface by the proximity head 200.

The separation of the first zone meniscus 102A and the second zone meniscus 102B may not always be precise. As a result the first liquid 112 and the second liquid 213 can mix somewhat in an inner area 102C of the meniscus 102. The inner zone 102C of the meniscus 102 is located near the inner return holes 217B. The precise shape, width and concentration of the mixture in the inner zone 102C can vary with many operational variables. By way of example, the relative flow rates of the first liquid 112 and the second liquid 213, and/or the relative velocity (e.g., in direction 122) of the meniscus 102 can result in more or less of the first liquid 112 flowing into the second zone 202B.

The variation in the shape, width and concentration of the mixture in the inner zone 102C can result in variations in the residence time of the desired concentration of the first liquid 112 in contact with the surface 108A. By way of example, if the first liquid 112 is an etching chemistry and the first liquid flows into the second zone 202B then the effective width D1 of the first zone 202A is extended, resulting in an increased residence time of the etching chemistry on the surface 108A. The increased residence time allows the etching chemistry to etch the surface 108A for a longer time (e.g., the time needed the first zone 102A to move across the width D1 in direction 122) and therefore the resulting etching operation is increased. Similarly, if the second liquid 213 flows into the first zone 202A, then the residence time for the first liquid 112 is decreased and therefore the etching operation can be decreased. Ideally, the separation of the first zone meniscus 102A and the second zone meniscus 102B is substantially precise (e.g., widths D1 and D3 substantially constant) under the process variations and thereby minimize the width D2 of the inner area 102C of the meniscus.

Figure 3A:
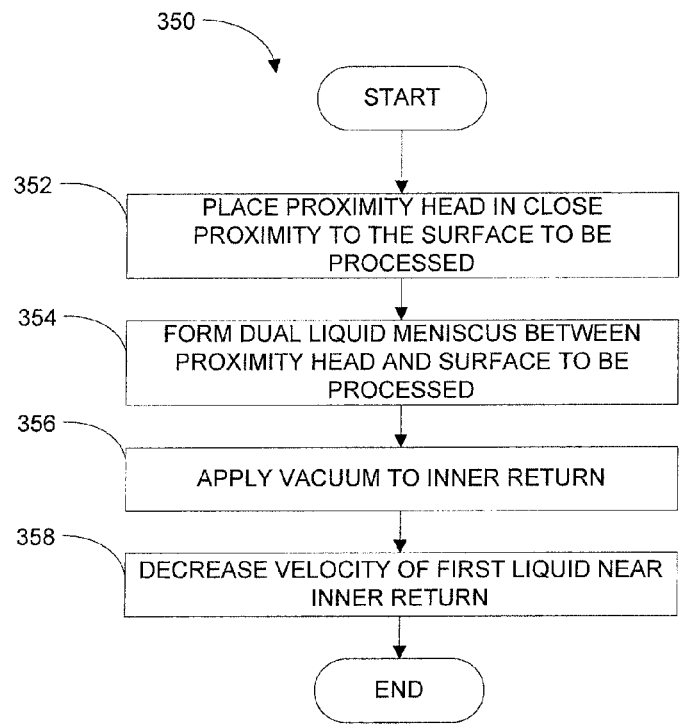
FIG. 3A is a flowchart diagram that illustrates the method operations performed in improving the separation between the first liquid and the second liquid, in accordance with one embodiment of the present invention.
Figure 3B:
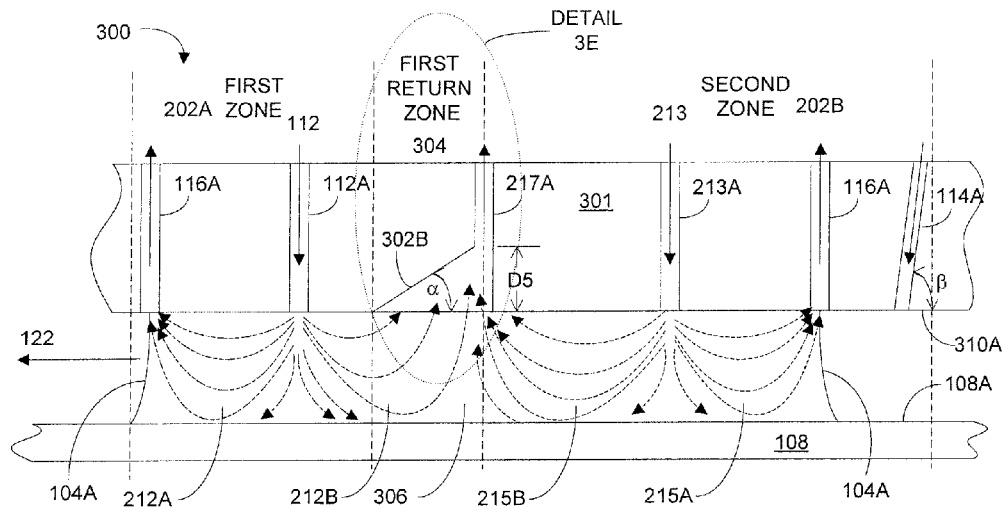
FIG. 3B is side view of a dual input proximity head, in accordance with an embodiment of the present invention.
Figure 3C:
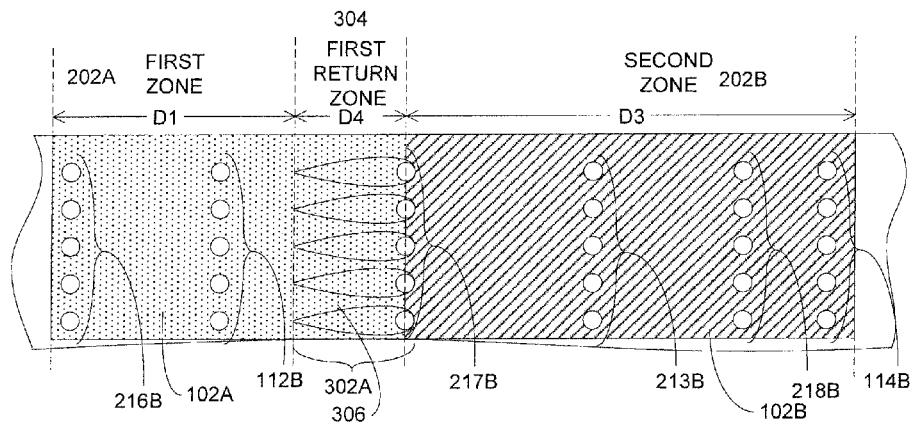
FIGS. 3C and 3D are bottom views of the head surface of the dual input proximity head, in accordance with embodiments of the present invention
Figure 3D:
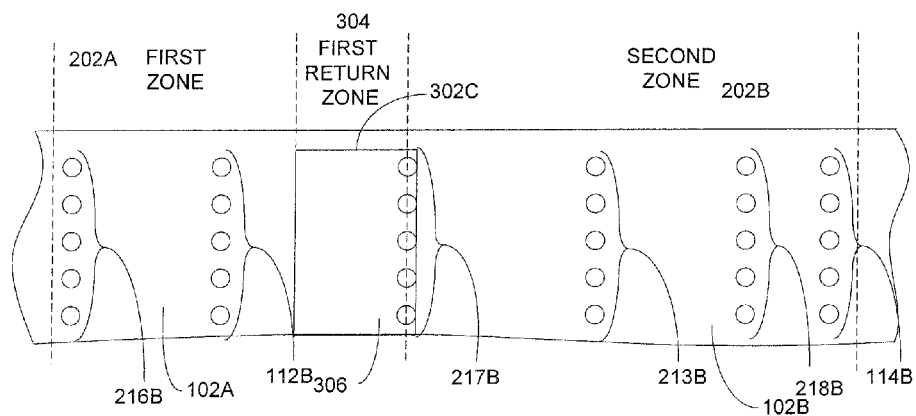

FIG. 3A is a flowchart diagram that illustrates the method operations 350 performed in improving the separation between the first liquid 112 and the second liquid 213, in accordance with one embodiment of the present invention. FIG. 3B is side view of a dual input proximity head 300, in accordance with an embodiment of the present invention. FIGS. 3C and 3D are bottom views of the head surface 310A of the dual input proximity head 300, in accordance with embodiments of the present invention.

In an operation 352, a proximity head 300 is placed in close proximity to the surface 108A to be processed. In an operation 354, a dual liquid meniscus 102 is formed between a head surface 310A and the surface 108A to be processed as described above.

In an operation 356, a vacuum is applied to the inner return conduit 217A as described above. Applying a vacuum to the inner return conduit 217A causes a portion of the first liquid 212B and a portion of the second liquid 215B to flow toward the inner return holes 217B.

In an operation 358, the portion of the first liquid 212B flowing toward the inner return holes 217B is slowed as the portion of the first liquid 212B nears the inner return holes so that the velocity of the portion of the first liquid 212B near the inner return holes is slower than the velocity of the portion of the second liquid 215B near the inner return holes.

The dual input proximity head 300 improves the separation of the first liquid 112 and the second liquid 213. The separation of the first liquid 112 and the second liquid 213 is improved by slowing the velocity of the first liquid 212B near the inner return holes 217B relative to the velocity of the second liquid 215B near the inner return holes. The slower velocity of the first liquid 212B near the inner return holes 217B substantially prevents the first liquid 112 flowing into the second zone 202B.

The velocity of the first liquid 112 near the inner return holes 217B can be reduced by reducing a restriction to the flow of the first liquid near the inner return holes such as by modifying the volume of the space between the head surface 310A and the surface 108A near the inner return holes 217B. As shown in FIG. 3B, the volume of a first return zone 306 of the meniscus is increased as compared to the proximity head 200 described above.

The volume of the first return zone 306 can be increased by adding chamfers 302A, as shown in FIG. 3C. The chamfers 302A extend from the inner return holes 217B toward the first holes 112B for a distance D4. D4 can be within a range of between about W2, as shown in FIG. 2A and about 1.5 mm. The chamfers 302A can have a depth of a distance D5. D5 can be within a range of about 0.1 mm to about one half H. The chamfers 320A can have a substantially straight upper surface 302B. Alternatively, the upper surface 302B can include a curve to further smooth the flow of the first liquid 212B. The upper surface 302B forms a first angle α of between about 1 and about 89 degrees with the surface 310A of the proximity head. By way of example the first angle α can be about 3.2 degrees, D4 can be equal to W2 minus about 2.0 mm and D5 can be equal to 0.5 mm.

The volume of the first return zone 306 can be increased by angling the portion of the proximity head surface 302C in the first return zone 304, as shown in FIG. 3D. Similar to the chamfer 302A, the surface portion 302C is sloped from the surface of the proximity head 310A toward the inner return holes 217B.

Figure 3E:
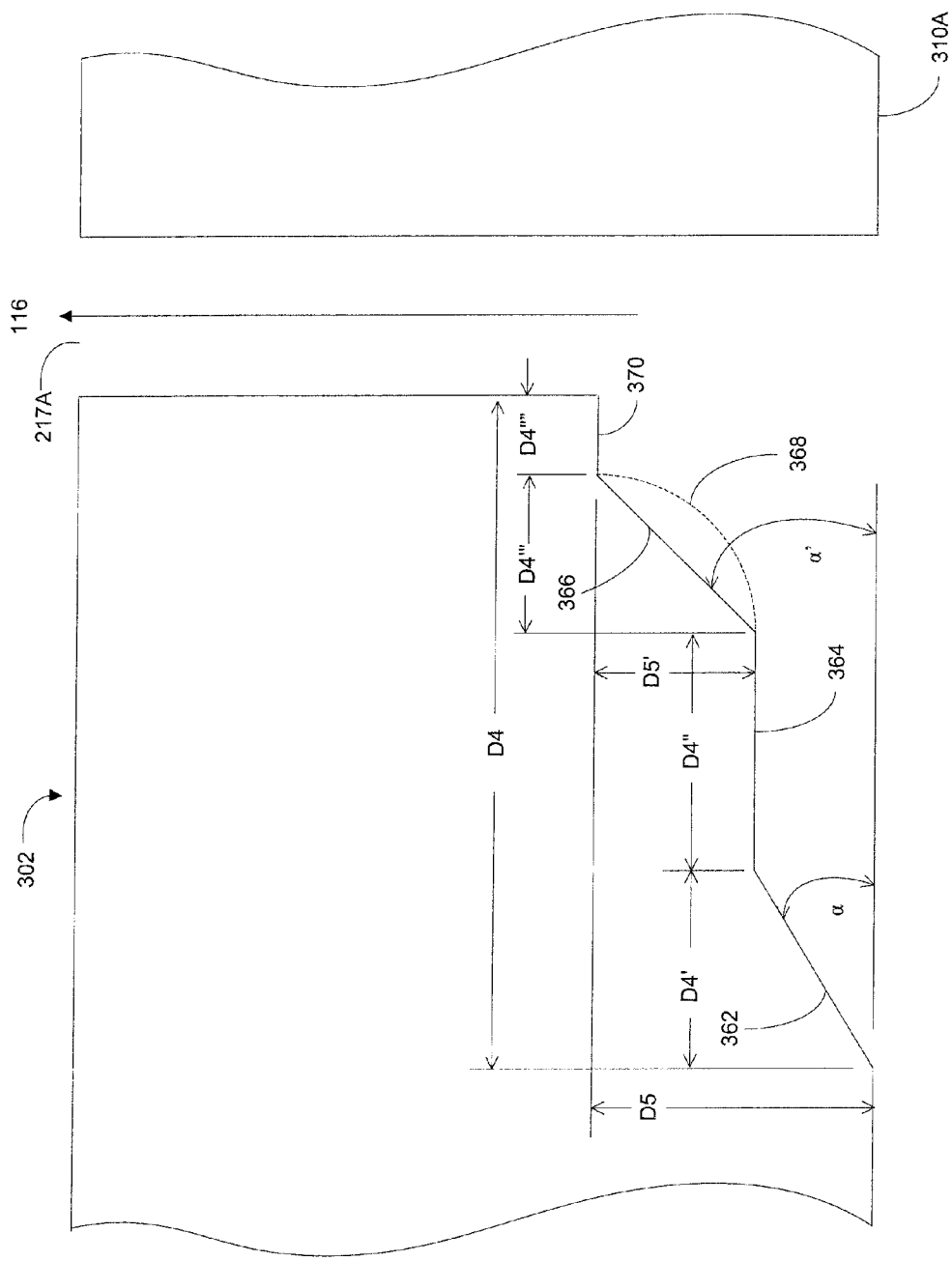
FIG. 3E is detailed view of the chamfer at the inner return conduit, in accordance with an embodiment of the present invention.

FIG. 3E is detailed view of the chamfer 302 at the inner return conduit 217A, in accordance with an embodiment of the present invention. The chamfer 302 can include multiple angled surfaces 362, 366, multiple substantially flat surfaces 364, 370 and/or curved surfaces 368 and combinations thereof. The chamfer 302 shown includes a first angled surface 362 that is formed at the first angle α to the head surface 310A.

A second angled surface 366 can also be included and a substantially flat surface 364 is formed between the first angled surface 362 and the second angled surface. The second angled surface 366 can form a corresponding angle α' with the head surface 310A. Angles α and α' can be equal or different. An optional substantially flat surface 370 can separate the second angled surface 366 from the inner return conduit 217A.

Alternatively, one or both of the first angled surface 362 and the second angled surface 366 can be replaced with an appropriately curved surface 368. The curved surface 368 is formed along a curve to optimize the flow characteristics of the first liquid 112 toward the inner return conduits 217A.

By way of example the curved surface 368 can be a substantially constant radius curve across the length of the second angled surface 366. Similarly, a single curved surface could be formed in place of both of the substantially flat surfaces 364, 370 and the angled surfaces 362, 366. The curved surface 368 can alternatively be a non-constant radius curve such as an elliptical curve or a complex curve having multiple radii.

The first angled surface 362 has a length of D4'. D4' can be between 0 and D4. By way of example, if a single angled surface 362 is formed, as shown in FIG. 3B above, then D4' is equal to D4.

The first substantially flat surface 364 length of D4". D4" can be equal to 0 to about 5.0 mm as may be desired to separate the first angled surface 362 and the second angled surface 366.

The second angled surface 366 has a length of D4'''. D4''' has a minimum value of 0, if the second angled surface 366 is not included. The maximum value of D4''' is determined by the desired performance characteristics.

The second substantially flat surface 370 has a length of D4''''. D4'''' has a minimum value of 0, if the second substantially flat surface 370 is not included. The maximum value of D4'''' is determined by the desired performance characteristics. D5' can be between about zero to D5 as may be desired by the combination of substantially flat, angled and curved surfaces. It should be understood that the embodiments described in FIGS. 3A-6B are not drawn to scale and that the relative dimensions of the features are illustrated disproportionately to more easily describe the features.

Figure 4A:
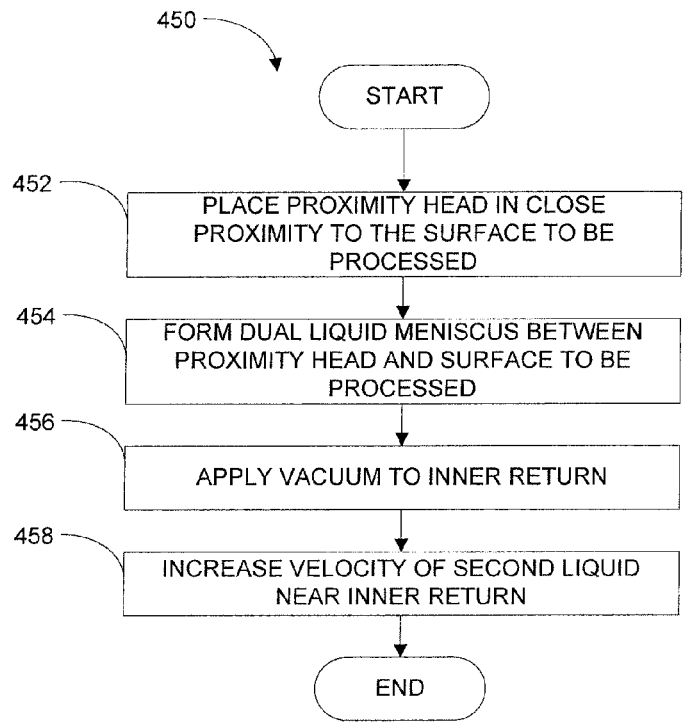
FIG. 4A is a flowchart diagram that illustrates the method operations performed in improving the separation between the first liquid and the second liquid, in accordance with one embodiment of the present invention.
Figure 4B:
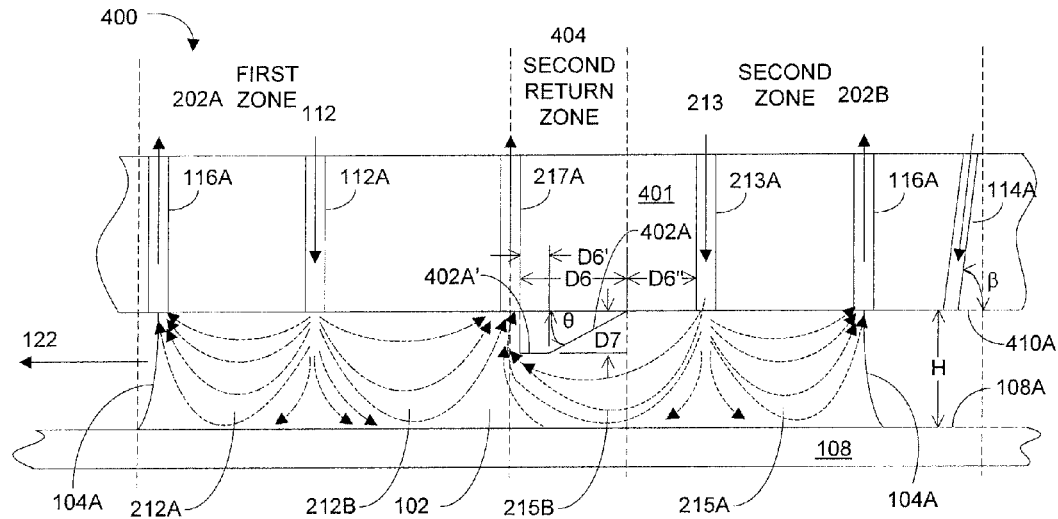
FIG. 4B is side view of a dual input proximity head, in accordance with an embodiment of the present invention.
Figure 4C:
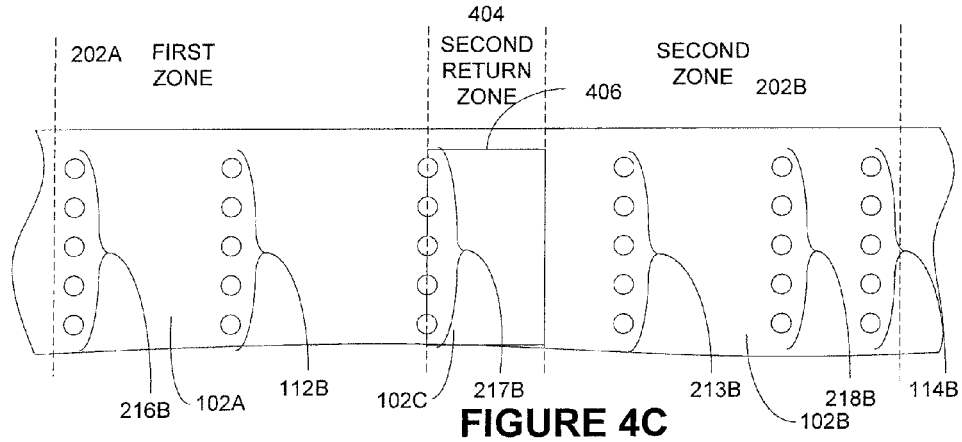
FIGS. 4C and 4D are bottom views of the head surface of the dual input proximity head, in accordance with embodiments of the present invention.
Figure 4D:
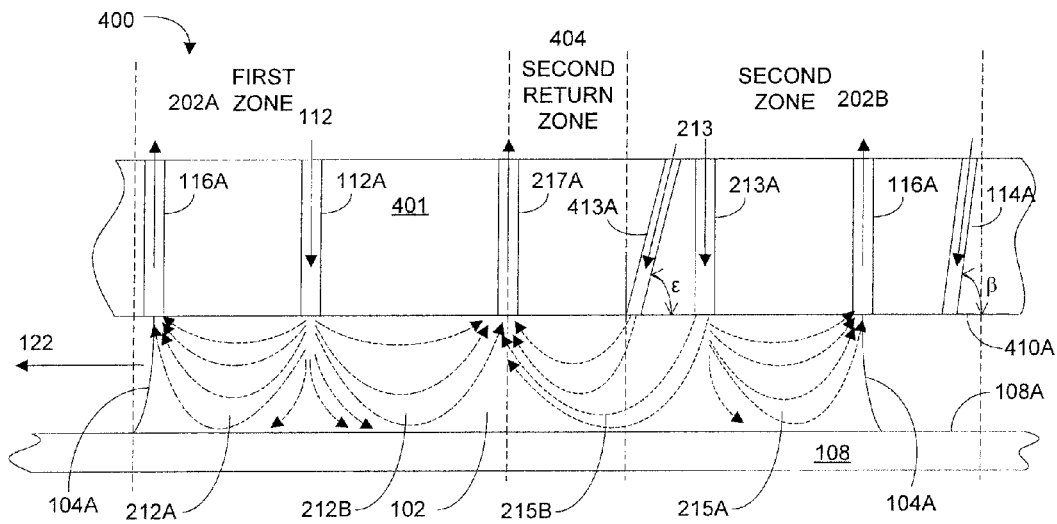

FIG. 4A is a flowchart diagram that illustrates the method operations 450 performed in improving the separation between the first liquid 112 and the second liquid 213, in accordance with one embodiment of the present invention. FIG. 4B is side view of a dual input proximity head 400, in accordance with an embodiment of the present invention. FIGS. 4C and 4D are bottom views of the head surface 410A of the dual input proximity head 400, in accordance with embodiments of the present invention.

In an operation 452, a proximity head 400 is placed in close proximity to the surface 108A to be processed. In an operation 454, a dual liquid meniscus 102 is formed between a head surface 410A and the surface 108A to be processed as described above.

In an operation 456, a vacuum is applied to the inner return conduit 217A as described above. Applying a vacuum to the inner return conduit 217A causes a portion of the first liquid 212B and a portion of the second liquid 215B to flow toward the inner return holes 217B.

In an operation 458, the velocity of portion of the second liquid 215B flowing toward the inner return holes 217B is increased as the portion of the second liquid 212B nears the inner return holes so that the velocity of the portion of the first liquid 212B near the inner return holes is slower than the velocity of the portion of the second liquid 215B near the inner return holes.

The dual input proximity head 400 improves the separation of the first liquid 112 and the second liquid 213. The separation of the first liquid 112 and the second liquid 213 is improved by increasing the velocity of the second liquid 215B near the inner return holes 217B relative to the velocity of the first liquid 212B near the inner return holes. The slower velocity of the first liquid 212B near the inner return holes 217B substantially prevents the first liquid 112 flowing into the second zone 202B.

The velocity of the second liquid 212B can be increased by increasing a restriction to the flow of the second liquid near the inner return holes such as by modifying the volume of the space between the head surface 410A and the surface 108A near the inner return holes 217B. As shown in FIG. 4B, the volume of a second return zone 406 of the meniscus is decreased as compared to the proximity head 200 described above.

The volume of the second return zone 406 can be decreased by angling a portion 402A of the head surface 410A, as shown in FIGS. 4B and 4C. The angled portion 402A extends from near the first holes 112B toward the inner return holes 217B for a distance D6. The angled portion 402A can also include a substantially flat portion 402A'. The substantially flat portion can extend from the inner return holes 217B toward the second holes 213B a distance D6'.

D6 can be within a range of about W2 as a maximum value to about 2 mm. D6' and D6" can be any desirable portions of D6. By way of example, D6' can be about 2.5 mm and D6" can be about 4 mm and D6 can be equal to W2 less D6" and D6'.

The angled portion 402A can extend from the head surface 410A a distance D7. D7 can be within a range of about 0.1 mm to about H/2. By way of example, D7 can be about 0.5 mm.

The angled portion 402A forms a second angle θ of between about 1 degree and about 89 degrees with the head surface 410A. By way of example the second angle θ can be about 5 degrees.

While the angled portion 402A is shown with only a single angled portion and a single flat portion, it should be understood that a more complex profile including multiple flat, angled and curved surfaces, similar to those described in detail in FIG. 3E above, can be formed in place of the angled portion. By way of example, the angled portion 402A can include one or more curved portions and/or one or more flat portions and one or more angled portions.

The velocity of the second liquid 212B can be increased by directing the flow of the second liquid 212B toward the inner return holes 217B. The flow of the second liquid 212B can be directed toward the inner return holes 217B by angling the second conduits 213A and/or providing one or more angled third conduits 413A, as shown in FIG. 4D. The angled third conduits 413A are formed to intersect the head surface at an angle ε. Angle ε can be between about 10 degrees and about 90 degrees.

Figure 5A:
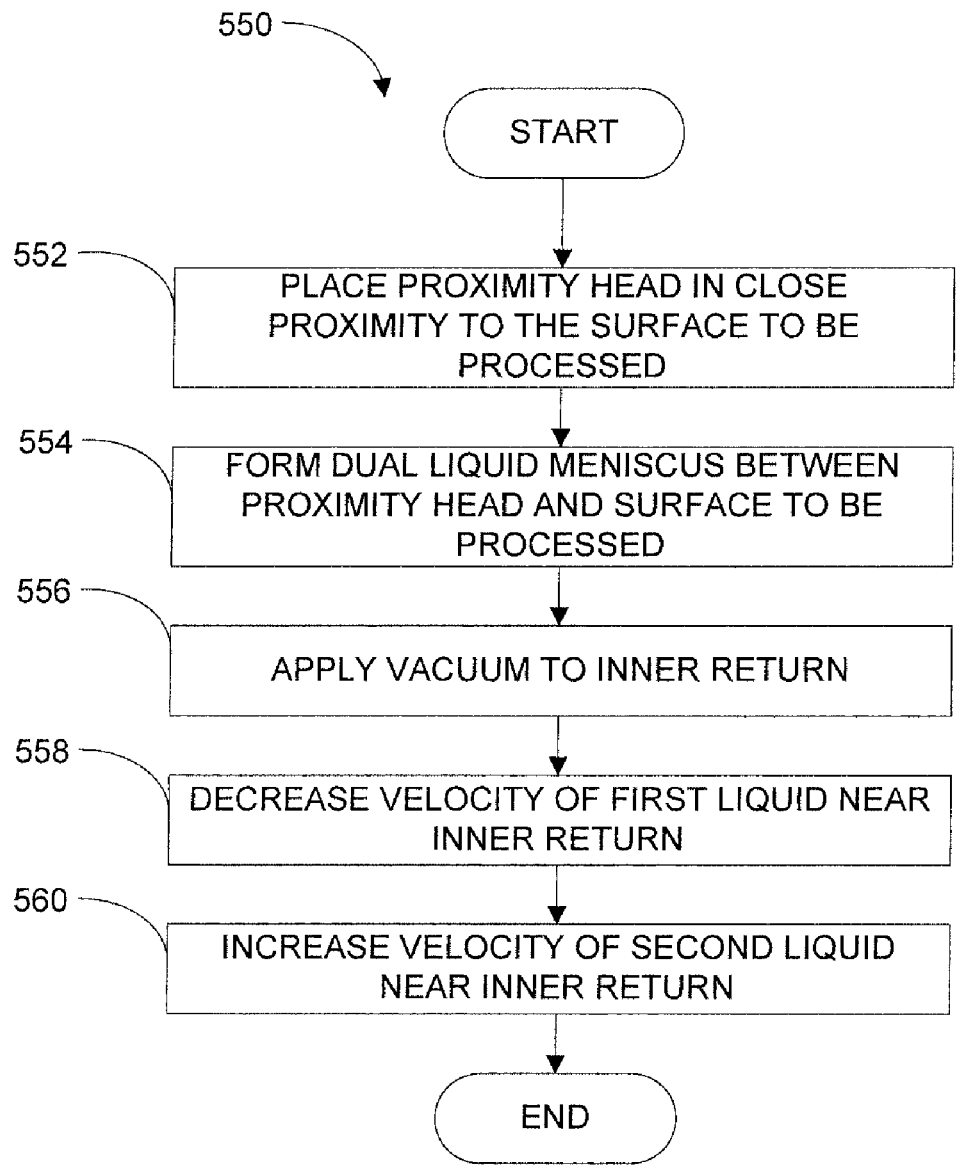
FIG. 5A is a flowchart diagram that illustrates the method operations performed in improving the separation between the first liquid and the second liquid 213, in accordance with one embodiment of the present invention.
Figure 5B:
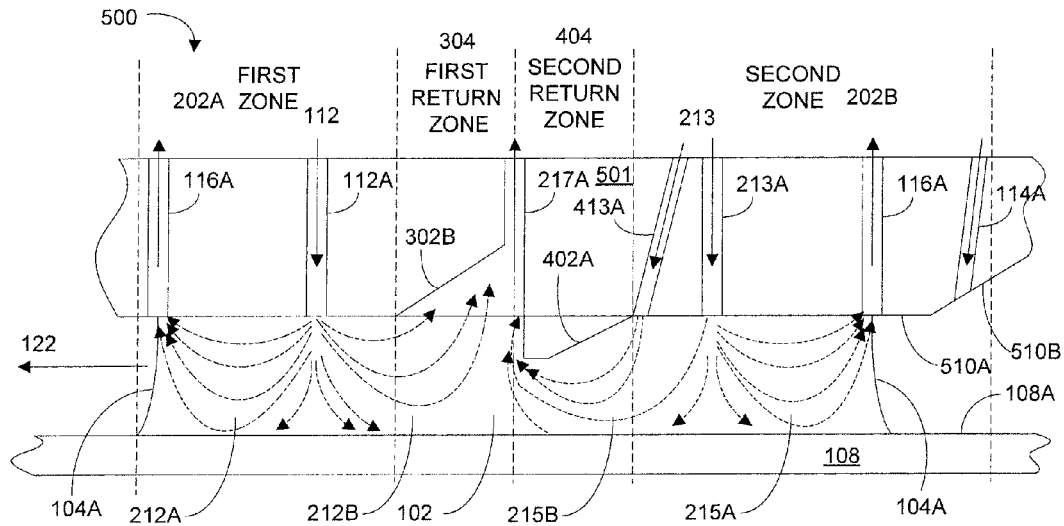
FIG. 5B is side view of a dual input proximity head, in accordance with an embodiment of the present invention.
Figure 5C:
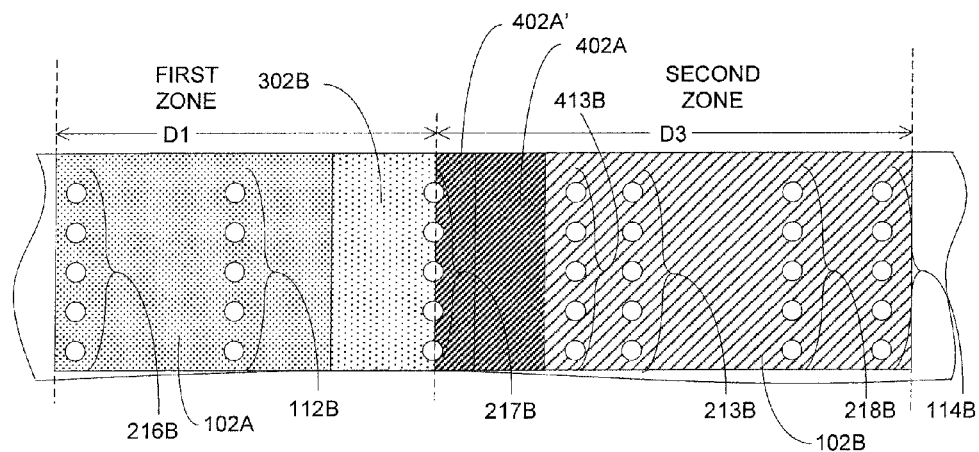
FIG. 5C is a bottom view of the meniscus and the head surface of the dual input proximity head, in accordance with an embodiment of the present invention.

FIG. 5A is a flowchart diagram that illustrates the method operations 550 performed in improving the separation between the first liquid 112 and the second liquid 213, in accordance with one embodiment of the present invention. FIG. 5B is side view of a dual input proximity head 500, in accordance with an embodiment of the present invention. FIG. 5C is a bottom view of the meniscus 102 and the head surface 510A of the dual input proximity head 500, in accordance with an embodiment of the present invention.

In an operation 552, a proximity head 500 is placed in close proximity to the surface 108A to be processed. In an operation 554, a dual liquid meniscus 102 is formed between a head surface 510A and the surface 108A to be processed as described above.

In an operation 556, a vacuum is applied to the inner return conduit 217A as described above. Applying a vacuum to the inner return conduit 217A causes a portion of the first liquid 212B and a portion of the second liquid 215B to flow toward the inner return holes 217B.

In an operation 558, the portion of the first liquid 212B flowing toward the inner return holes 217B is slowed as the portion of the first liquid 212B nears the inner return holes so that the velocity of the portion of the first liquid 212B near the inner return holes is slower than the velocity of the portion of the second liquid 215B near the inner return holes.

In an operation 560, the velocity of a portion of the second liquid 215B flowing toward the inner return holes 217B is increased as the portion of the second liquid 212B nears the inner return holes so that the velocity of the portion of the first liquid 212B near the inner return holes is slower than the velocity of the portion of the second liquid 215B near the inner return holes.

The dual input proximity head 500 improves the separation of the first liquid 112 and the second liquid 213. The separation of the first liquid 112 and the second liquid 213 is improved by increasing the velocity of the second liquid 215B near the inner return holes 217B relative to the velocity of the first liquid 212B near the inner return holes. The slower velocity of the first liquid 212B near the inner return holes 217B substantially prevents the first liquid 112 flowing into the second zone 202B.

The velocity of the first liquid 112 near the inner return holes 217B is reduced by increasing the volume of the space between the head surface 310A and the surface 108A near the inner return holes 217B. The volume of the first return zone 306 of the meniscus is increased as compared to the proximity head 200 described above.

Figure 5D:
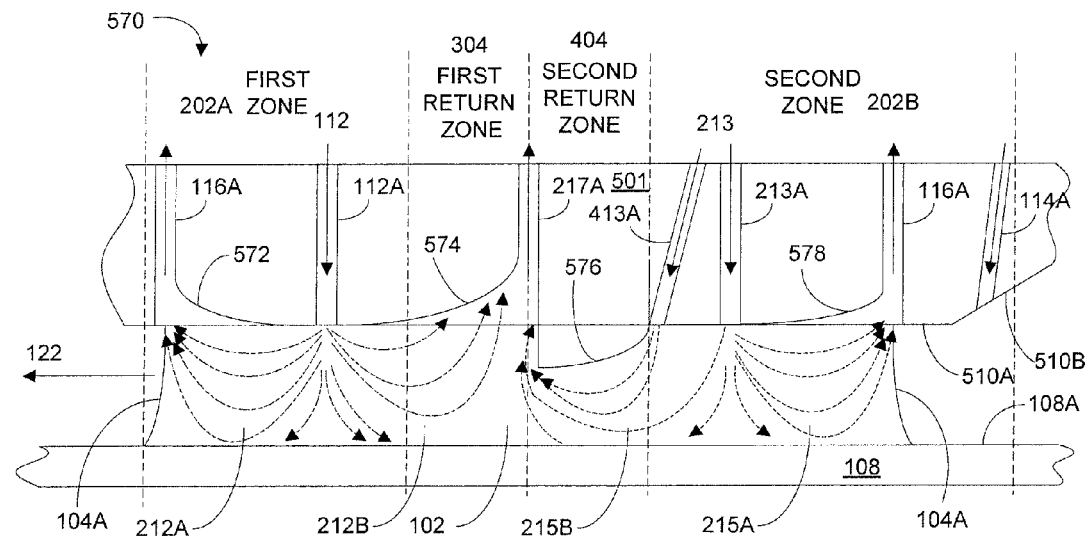
FIGS. 5D and 5E are side views of dual input proximity heads 570 and 580, in accordance with embodiments of the present invention.
Figure 5E:
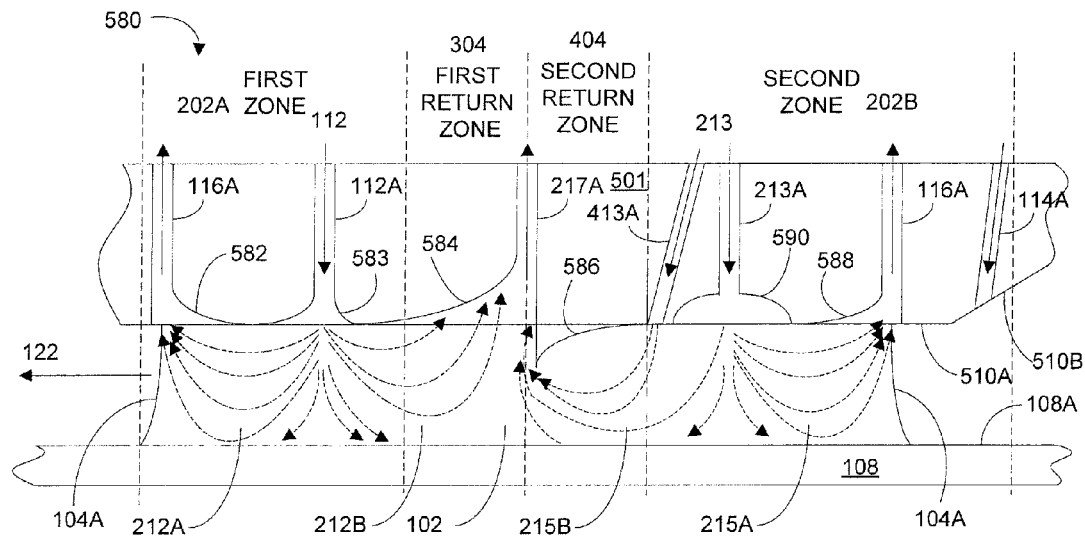

The velocity of the second liquid 212B is increased by decreasing the volume in the second return zone 406. The velocity of the second liquid 212B is also increased by directing a portion of the second liquid 213 toward the inner return holes 217B through the angled second conduits. The velocity of the second liquid 212B is also increased by directing the flow of the second liquid 212B toward the inner return holes 217B through the angled second conduits 413A. FIGS. 5D and 5E are side views of dual input proximity heads 570 and 580, in accordance with embodiments of the present invention. One or more curved surfaces 572-590 can be included in one or more of the embodiments described above.

Figure 6A:
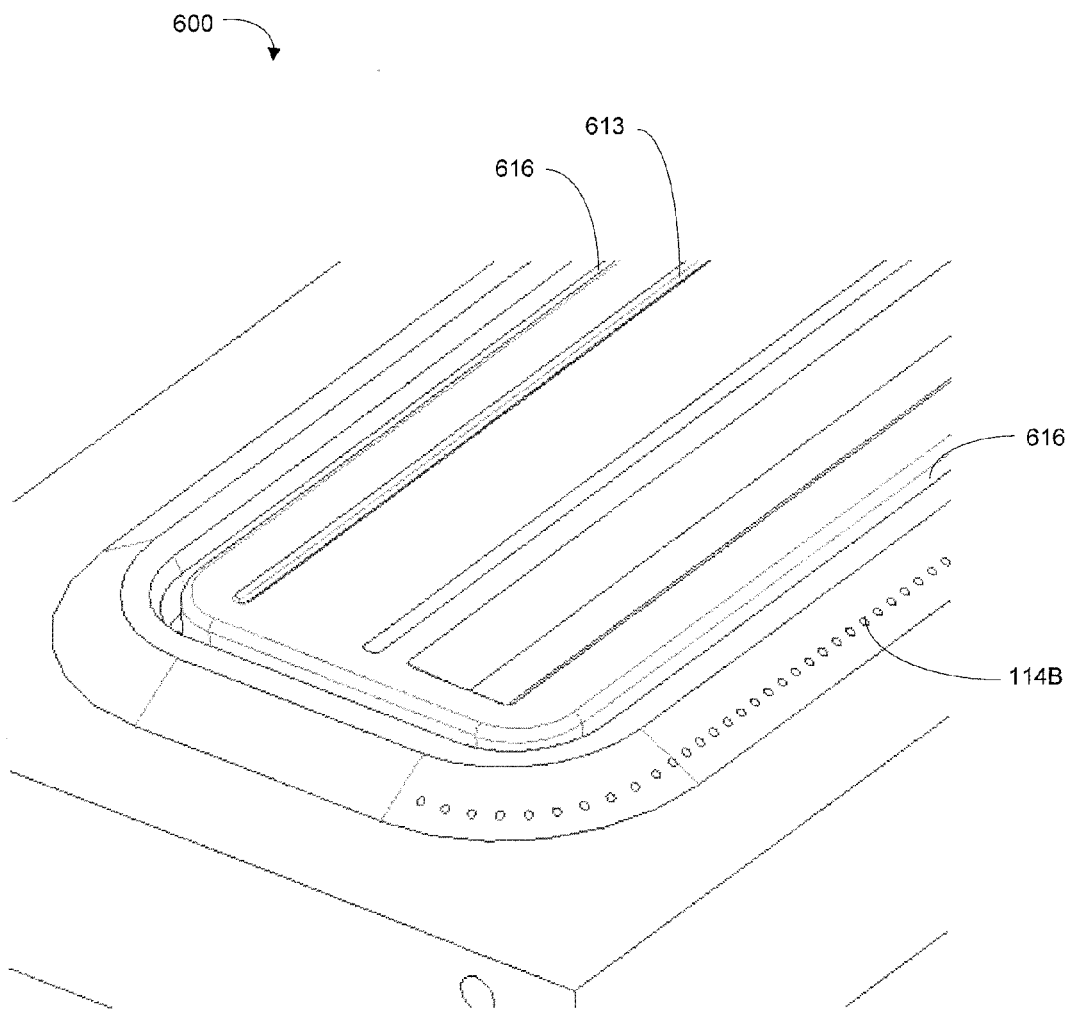
FIG. 6A is a dual input proximity head, in accordance with and embodiment of the present invention.
Figure 6B:
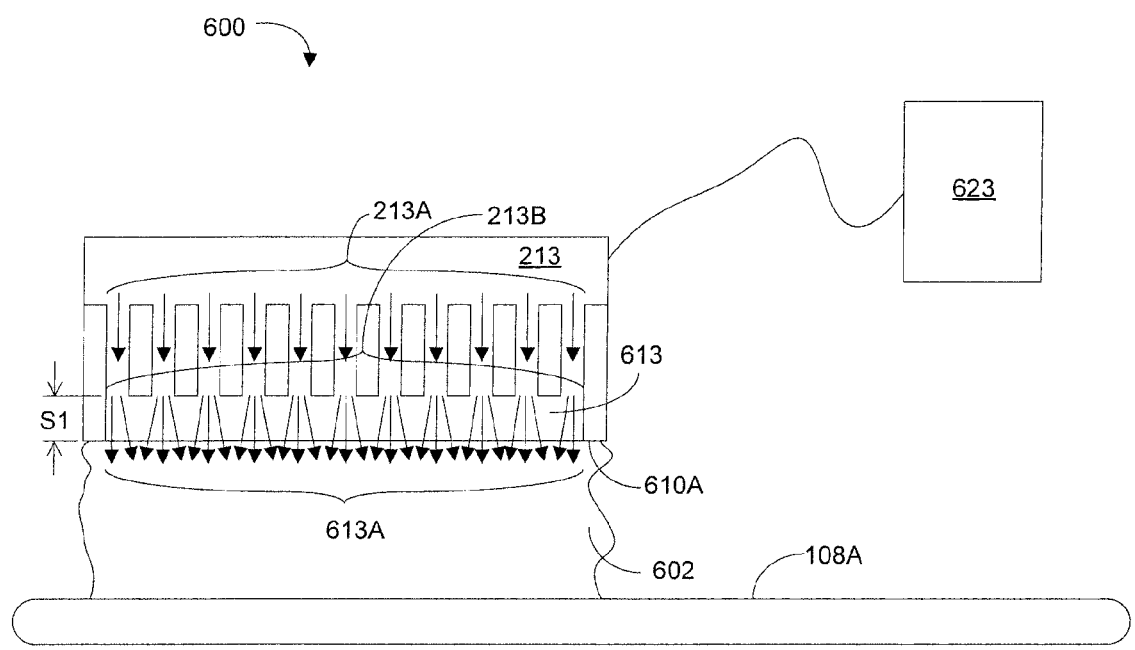
FIG. 6B is a section view of the dual input proximity head, in accordance with and embodiment of the present invention.

FIG. 6A is a dual input proximity head 600, in accordance with and embodiment of the present invention. FIG. 6B is a section view of the dual input proximity head 600, in accordance with and embodiment of the present invention. The dual input proximity head 600 is similar to the dual input proximity heads 300, 400 and 500 described above. At least one row of the holes 112B, 213B, 216B, 217B, 218B can be formed in a corresponding slot 612, 613, 616, 617, 618.

A source 623 of the second liquid 213 is coupled to the proximity head 600. The source 623 supplies the second liquid 213 to the second conduits 213A. The second conduits 213A end in the second holes 213B in the slot 613. The slot 613 provides a more evenly distributed flow 613A of the second liquid 213 from the holes 213B before the second liquid reaches the meniscus 602 and the surface being processed 108A.

The slot 613 has a depth S1 of about 2.5 mm to about 10 mm. The slot 613 has a width of about 0.1 mm to about 1.5 mm.

It should be understood that while slot 613 is described in detail the remaining slots 612, 616, 617, 618 can be similarly formed.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention or portions thereof can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion. It will be further appreciated that the instructions represented by the operations in the above figures are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A method of forming a meniscus comprising:
   moving a proximity head surface in close proximity to a surface to be processed,
   forming a dual liquid meniscus between the proximity head surface and the surface to be processed including:
      forming a first meniscus in a first zone by supplying a first liquid, the first zone including a plurality of first discrete holes, at least a portion of the plurality of first discrete holes are arranged in a first row; and
      forming a second meniscus in a second zone by supplying a second liquid, the second zone being separated from the first zone by an inner return zone in the proximity head surface; and
   removing a portion of the first liquid and the second liquid through the inner return zone, the inner return zone including a plurality of inner return discrete holes wherein, a first portion of an edge of each one of the plurality of inner return discrete holes is recessed into the head surface, wherein the recessed first portion of an edge of each one of the plurality of inner return discrete holes is recessed into the head surface at a first angle, the first angle forms a chamfer extending from the recessed first portion of an edge of each one of the plurality of inner return discrete holes toward the first row for a first distance, wherein the chamfer being defined from the recessed first portion of the edge of each one of the plurality of inner return discrete holes to a surface of the inner return zone.

2. The method of claim 1, wherein removing the portion of the first liquid and the second liquid through the inner return zone includes decreasing a velocity of the first liquid proximal to the inner return zone to a first velocity wherein the first velocity is less than a second velocity of the second liquid proximal to the inner return zone.

3. The method of claim 2, wherein decreasing a velocity of the first liquid proximal to the inner return zone includes drawing the first liquid across a first angled surface in the first zone, the first angled surface having a first edge protruding from the proximity head surface and an opposing second edge proximate to the inner return zone, the second edge intersecting with the proximity head surface.

4. The method of claim 1, wherein removing the portion of the first liquid and the second liquid through the inner return zone includes decreasing a velocity of the first liquid proximal to the inner return to a first velocity wherein the first velocity is less than a second velocity of the second liquid proximal to the inner return zone and wherein the second velocity is increased proximal to the inner return zone.

5. The method of claim 4, wherein increasing the second velocity proximal to the inner return zone includes drawing the second liquid across a second zone angled surface in the second zone, the second zone angled surface having a first edge protruding from the proximity head surface and proximate to the inner return zone, the second zone angled surface having an opposing second edge the second edge intersecting with the proximity head surface.

6. The method of claim 1, wherein the proximity head surface includes:

the first zone including a first flat surface region, each one of the plurality of first discrete holes being connected to a corresponding one of a plurality of first conduits, the plurality of first discrete holes residing in the head surface and extending through the first flat surface region;

the second zone including a second flat region and a plurality of second discrete holes, each one of the plurality of second discrete holes being connected to a corresponding one of a plurality of second conduits, the plurality of second discrete holes residing in the head surface and extending through the second flat surface region; and each one of the plurality of the inner return discrete holes being connected to a corresponding one of a plurality of inner return conduits, the plurality of inner return discrete holes residing in the head surface and extending through the head surface, at least a portion of the plurality of inner return discrete holes are arranged in an inner return row, the first row and the inner return row being substantially parallel, wherein the plurality of first conduits are coupled to a first liquid source, wherein the plurality of first conduits are capable of delivering a controlled quantity of a first liquid to a liquid meniscus formed in a volume between the head surface and a surface being processed, the surface being processed being substantially parallel to the head surface, the plurality of inner return conduits are coupled to a vacuum source and configured to remove at least a portion of the first liquid from the head surface, the plurality of second conduits are coupled to a surface tension control fluid source, the liquid meniscus having a first edge defined by the recessed first portion of an edge of each one of the plurality of inner return discrete holes.

7. The method of claim 6, wherein the first zone further includes:
   a plurality of third discrete holes, each one of the plurality of third discrete holes being connected to a corresponding one of a plurality of third conduits, the plurality of third discrete holes residing in the head surface and extending through the first flat surface region, at least a portion of the plurality of third discrete holes are arranged in a third row, the third row being substantially parallel to the first row, the third row being disposed on a side of the first row opposing the inner return zone.

8. The method of claim 6, wherein the recessed first portion of an edge of each one of the plurality of inner return discrete holes is included in a recessed first angled portion having a first recessed edge at each one of the plurality of inner return discrete holes and the recessed first angled portion including a second recessed edge intersecting the head surface and wherein the recessed first angled portion extends from the inner return row toward the first row for a first distance.

9. The method of claim 8, wherein the recessed first angled portion includes more than one angled portion.

10. The method of claim 8, wherein the recessed first angled portion includes one or more curved portions.

11. The method of claim 8, wherein the first recessed edge includes a curved portion from the recessed first angled portion into each one of the plurality of inner return discrete holes.

12. The method of claim 6, wherein at least a portion of the plurality of second discrete holes are arranged in a second row, the second row and the inner return row being substantially parallel, the second row opposing the first row and wherein the second zone further includes:
   a plurality of fifth discrete holes and plurality of fourth discrete holes, each one of the plurality of fifth discrete holes being connected to a corresponding one of a plurality of fifth conduits, each one of the plurality of fourth discrete holes being connected to a corresponding one of a plurality of fourth conduits, the plurality of fifth discrete holes and the plurality of fourth discrete holes residing in the head surface and extending through the second flat surface region, at least a portion of the plurality of fifth discrete holes are arranged in a third row, at least a portion of the plurality of fourth discrete holes are arranged in a fourth row, wherein the third row and at least a portion of the fourth row being substantially parallel to the second row, the third row being disposed on a side of the second row opposing the inner return row, the fourth row being disposed on a side of the fifth row opposing the second row.

13. The method of claim 12, wherein the plurality of inner return conduits and the plurality of fifth conduits being configured to remove at least a portion of the second liquid from the head surface, the plurality of sixth conduits being configured to provide a first fluid to the head surface, the first fluid being different than the first liquid and the surface tension control fluid.

14. The method of claim 6, wherein the second zone includes a protrusion having an angled surface, the angled surface having a first edge, the first edge intersecting the head surface between the second row and the inner return row, the angled surface having a second edge proximate to the inner return row, the second edge protruding from the head surface a protruding distance less than a distance between the head surface and a surface to be processed.

15. The method of claim 14, wherein the angled surface intersects the head surface at an angle of between about 1 degree and about 89 degrees.

16. The method of claim 15, wherein the angled surface includes more than one angled surface.

17. The method of claim 16, wherein at least one of the more than one angled surface is substantially parallel to the head surface.

18. The method of claim 6, wherein at least a portion of the plurality of second conduits intersect the head surface at an angle of between about 10 degrees and about 90 degrees and directed toward the inner return row.

19. The method of claim 6, wherein at least a portion of at least one of the first flat surface region and the second flat surface region is curved.

* * * * *